United States Patent

Oka et al.

[11] Patent Number: 5,891,828
[45] Date of Patent: Apr. 6, 1999

[54] METHOD OF PRODUCING SUPERCONDUCTING $PRBA_2CU_3O_Y$ SINGLE CRYSTAL AND $PRBA_2CU_3O_Y$ SUPERCONDUCTING DEVICE

[75] Inventors: Kunihiko Oka; Zhigang Zou; Toshimitsu Ito, all of Tsukuba; Hiroshi Akoh, Tsuchiura, all of Japan

[73] Assignee: Agency of Industrial Science & Technology, Ministry of International Trade & Industry, Tokyo, Japan

[21] Appl. No.: 824,752

[22] Filed: Mar. 26, 1997

[30] Foreign Application Priority Data

Oct. 14, 1996 [JP] Japan ................................ 8-270769
Oct. 21, 1996 [JP] Japan ................................ 8-277768

[51] Int. Cl.[6] .................................................. C30B 13/02
[52] U.S. Cl. .......................... 505/451; 505/100; 505/126; 505/190; 505/702; 505/729; 117/49; 117/37; 117/931; 117/947
[58] Field of Search ............................... 117/49, 1, 3, 7, 117/37, 937, 947; 505/193, 100, 126, 110, 190, 702, 451, 729

[56] References Cited

U.S. PATENT DOCUMENTS

| | | | |
|---|---|---|---|
| 5,409,892 | 4/1995 | Hayashi | 505/451 |
| 5,444,040 | 8/1995 | Kojima | 117/49 |
| 5,602,081 | 2/1997 | Nakamura | 505/451 |
| 5,611,854 | 3/1997 | Veal | 117/1 |
| 5,627,142 | 5/1997 | Yamada | 505/541 |
| 5,648,319 | 7/1997 | Morita | 505/729 |

*Primary Examiner*—Robert Kunemund
*Attorney, Agent, or Firm*—Oblon, Spivak, McClelland, Maier & Neustadt, P.C.

[57] ABSTRACT

$PrBa_2Cu_3O_Y$ exhibiting superconductivity is provided by a method including the steps of preparing a solvent consisting of a mixture of praseodymium oxide, at least one of barium oxide and barium carbonate, and copper oxide at a mixing ratio of between 1:3:5 and 1:8:20, disposing the solvent between a feed rod of $PrBa_2Cu_3O_7$ formed to a high density and a seed crystal, heating the solvent to a temperature of 880°–980° C. in an atmosphere of an inert gas of at least one of argon and nitrogen mixed with 0.01–2% oxygen to form a floating solvent zone, moving the floating solvent zone toward the feed rod at 0.1–1.0 mm/hr under a temperature gradient at the solid-liquid interface of 25°–35° C./mm to precipitate single crystal on the seed crystal, and heat-treating the single crystal obtained in an atmosphere containing not less than 15% oxygen. Another aspect of the invention provides a superconducting device including the superconducting $PrBa_2Cu_3O_Y$ single crystal material in combination with at least one non-superconducting $PrBa_2Cu_3O_Y$ crystal material.

5 Claims, 4 Drawing Sheets

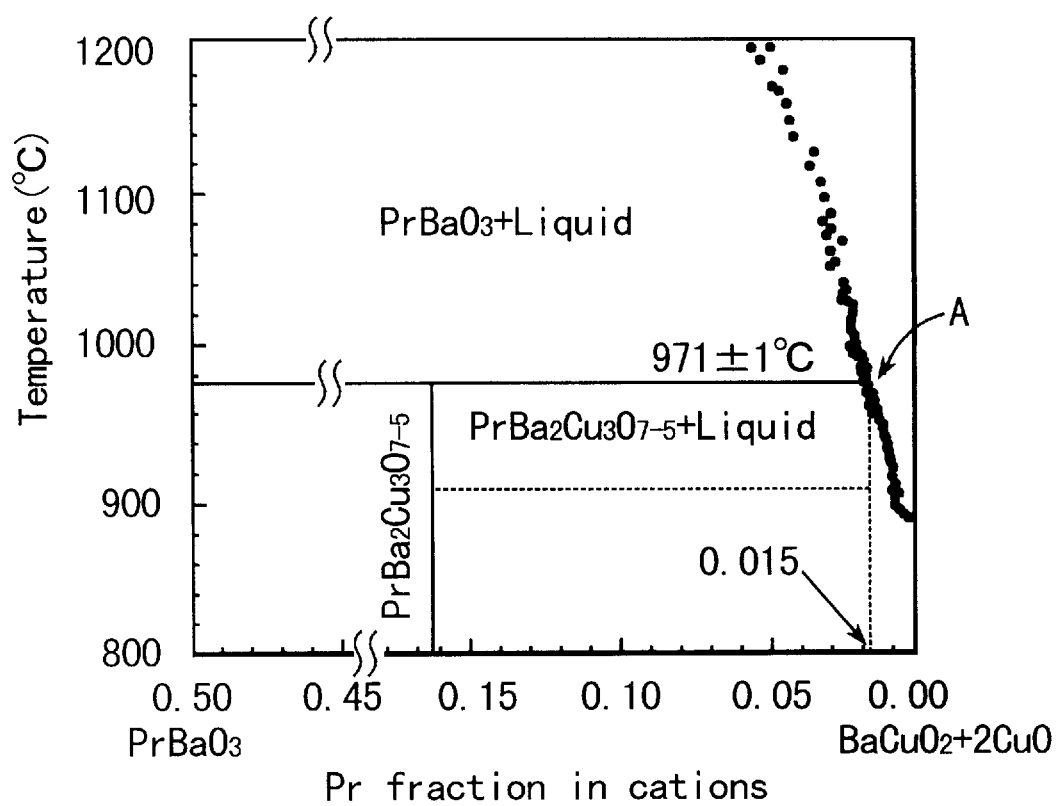
F I G. 1

1

METHOD OF PRODUCING SUPERCONDUCTING PRBA$_2$CU$_3$O$_Y$ SINGLE CRYSTAL AND PRBA$_2$CU$_3$O$_Y$ SUPERCONDUCTING DEVICE

BACKGROUND OF THE INVENTION

1. Field of the Invention

This invention relates to a method of producing structural formula PrBa$_2$Cu$_3$O$_Y$ single crystal exhibiting superconductivity and a superconducting device constituted solely of PrBa$_2$Cu$_3$O$_Y$ crystal materials at least one of which is PrBa$_2$Cu$_3$O$_Y$ crystal exhibiting superconductivity.

2. Description of the Prior Art

It is generally held that substances of the so-called 123 structure represented by the structural formula RBa$_2$Cu$_3$O$_Y$ (R=rare earth element, Y=7−y) exhibit superconductivity in the temperature range of 80–90 K, giving hope of their usability to configure superconducting devices that can operate even at the temperature of inexpensive liquid nitrogen. The conventional view has been, however, that when the rare earth element is Pr, i.e., in the case of PrBa$_2$Cu$_3$O$_Y$, superconductivity is not exhibited despite the 123 structure. The PrBa$_2$Cu$_3$O$_Y$ single crystal produced by the floating zone method reported earlier by the inventors in Japanese Patent Application No. 6-531725 (Example 3), for example, did not exhibit superconductivity.

Up to now, therefore, proposed uses of PrBa$_2$Cu$_3$O$_Y$ have been limited to those that utilize its non-superconducting properties (insulating, semiconductor and normal conducting properties) in such applications as a tunnel junction barrier or interlayer isolation material in Josephson devices (superconducting devices using the Josephson effect) utilizing thin film of another type of 123 structure. It has been considered impossible to configure Josephson devices and the like from PrBa$_2$Cu$_3$O$_Y$ either in its pure form or as doped with a small amount of some other element. (No such device has yet been reported.) It is known, however, that when an oxide high-temperature superconducting Josephson device is fabricated as a laminated structure consisting of different types of thin film or using a combination of substrate materials and includes non-superconducting PrBa$_2$Cu$_3$O$_Y$ thin film as only a part thereof, difference in lattice constant and/or coefficient of thermal expansion produces distortion at the junction interface, a critical part of such a device, and leads to decreased performance owing to degradation of electrical resistance and superconducting properties.

Further, in a superconducting three-terminal device utilizing superconductor-insulator transition produced by controlling the carrier (electron and hole) density in the oxide high-temperature superconductor from the outside, the amount of change in superconductivity for a given change in carrier density is small, making it difficult to fabricate a useful device.

In order to overcome these difficulties, the inventors demonstrate that, contrary to common belief, PrBa$_2$Cu$_3$O$_Y$ exhibiting superconductivity exists, propose a superconducting device consisting solely of PrBa$_2$Cu$_3$O$_Y$, namely of non-superconducting PrBa$_2$Cu$_3$O$_Y$ and superconducting PrBa$_2$Cu$_3$O$_Y$ in combination, and further propose a specific method of producing superconducting PrBa$_2$Cu$_3$O$_Y$.

Through extensive research, the inventors discovered that conventionally produced PrBa$_2$Cu$_3$O$_Y$ single crystal does not exhibit superconductivity because the crystal production method based on conventional technology deprive it of this property.

Specifically, since production of superconducting PrBa$_2$Cu$_3$O$_Y$ single crystal requires further improvement of single crystal quality, it is highly important to eliminate causes obstructing manifestation of superconductivity from PrBa$_2$Cu$_3$O$_Y$ single crystal produced by the prior-art floating zone method to the utmost possible. For this, it is necessary to ascertain crystal production conditions for PrBa$_2$Cu$_3$O$_Y$ that enable crystal growth to progress stably. Important factors include the atmosphere conditions and the crystal growth rate. PrBa$_2$Cu$_3$O$_Y$ crystal production conditions for the purpose of obtaining a superconductor have not been reported to date.

In light of the foregoing circumstances, the inventors conducted repeated single crystal production experiments with regard to PrBa$_2$Cu$_3$O$_Y$. As a result, they discovered crystal production conditions for obtaining PrBa$_2$Cu$_3$O$_Y$ capable of functioning as a superconductor. Based on the results of this research, this invention provides a floating zone method in accordance with conditions suitable for production of superconducting PrBa$_2$Cu$_3$O$_Y$ single crystal.

SUMMARY OF THE INVENTION

Specifically, the method of this invention comprises the steps of preparing a solvent consisting of a mixture of praseodymium oxide, at least one of barium oxide and barium carbonate, and copper oxide at a mixing ratio of between 1:3:5 and 1:8:20, disposing the solvent between a feed rod of PrBa$_2$Cu$_3$O$_7$ formed to a high density of not less than 95% and a seed crystal, heating the solvent to a temperature of 880°–980° C. in an atmosphere of an inert gas of least one of argon and nitrogen mixed with 0.01–2% oxygen to form a floating solvent zone, moving the floating solvent zone toward the feed rod at 0.1–1.0 mm/hr under a temperature gradient at the solid-liquid interface of 25°–35° C./mm to precipitate single crystal on the seed crystal, and heat-treating the single crystal obtained in an atmosphere containing not less than 15% oxygen.

The principle of the single crystal precipitation in this invention will be explained with reference to the PrBaO$_3$-BaCu$_3$O$_4$ system phase-equilibrium diagram of FIG. 1. This figure shows that when the temperature of PrBa$_2$Cu$_3$O$_7$, for example, is increased by heating, the PrBa$_2$Cu$_3$O$_7$ undergoes incongruent melting in the vicinity of 970° C., and that when a mixed raw material containing BaCu$_3$O$_4$ at a ratio of 0.485 and PrBaO$_3$ at a ratio of up to 0.015 is melted by heating to 880°–970° C. and the solvent is then gradually lowered in temperature, the composition of the solvent shifts to the BaCu$_3$O$_4$ side along the liquidus line, causing precipitation of solid-phase PrBa$_2$Cu$_3$O$_Y$. If the composition of the solvent is on the PrBaO$_3$ side of point A, PrBaO$_3$ is the first to precipitate during cooling, making it impossible to precipitate and grow PrBa$_2$Cu$_3$O$_7$ single crystal.

On the other hand, in this invention the flux disposed between the PrBa$_2$Cu$_3$O$_Y$ feed rod and the seed crystal in the floating zone method is, as pointed out earlier, composed of a mixture of praseodymium oxide, at least one of barium oxide and barium carbonate, and copper oxide at a mixing ratio of between 1:3:5 and 1:8:20. This was not simply calculated from the PrBaO$_3$-BaCu$_3$O$_4$ system phase-equilibrium diagram of FIG. 1. While this phase-equilibrium diagram teaches that PrBa$_2$Cu$_3$O$_Y$ precipitates from the solvent in solid phase when the mixture obtained by mixing PrBaO$_3$ with the BaCu$_3$O$_4$ flux has a Pr:Ba:Cu ratio up to 1:33:97, the flux adhered to the feed rod before the start of crystal growth wets the feed rod and changes in composition at the time of adherence or up to stabilization of the solvent zone. The aforesaid limits set by this invention regarding the range of the solvent composition adhered to the raw material before testing were calculated by the inventors for the first time based on a large number of tests.

This invention further calls for heating the solvent in an atmosphere of an inert gas of least one of argon and nitrogen mixed with 0.01–2% oxygen to form a floating solvent zone. When the oxygen partial pressure of the atmosphere is set at such an extremely low level, little wetting of the feed rod by the melted solvent occurs and the stability of the floating solvent zone can be maintained. When the oxygen content exceeds 2%, the solvent zone tends to spill easily, which destabilizes maintenance of the solvent zone. When it is lower than 0.001%, $PrBa_2Cu_3O_Y$ single crystal does not precipitate.

Argon or nitrogen is preferably used as the inert gas. The crystallinity of the obtained $PrBa_2Cu_3O_Y$ is better and the size of the individual crystal grains is larger in the case of nitrogen than in the case of argon.

In this invention, single crystal is precipitated on the seed crystal by moving the floating solvent zone toward the feed rod at 0.1–1.0 mm/hr under a temperature gradient at the solid-liquid interface of 25°–35° C./mm. The crystal growth rate is determined by the temperature gradient at the solid-liquid interface. Specifically, it increases with increasing temperature gradient. Conventionally, the temperature gradient at the solid-liquid interface has been set at around 20° C./mm. In this invention, it is set at 25°–35° C./mm, preferably at 30° C./mm, so as to obtain $PrBa_2Cu_3O_Y$ having excellent crystallinity.

To obtain good-quality single crystal, the moving speed of the floating solvent zone is set at 0.1–1.0 mm/hr. When the moving speed of the floating solvent zone is set below 0.1 mm/hr, the solvent zone becomes unstable owing to the effect of wetting of the high-density feed rod. This problem persists even if the furnace is modified to produce a sharp temperature gradient at the solid-liquid interface. Moving the solvent zone faster than 1 mm/hr degrades crystal quality and gives rise to phases other than $PrBa_2Cu_3O_Y$. Inclusion of $BaCu_3O_4$ is particularly undesirable because it causes the entire crystal to disintegrate into powder.

In this invention, the high-quality $PrBa_2Cu_3O_Y$ single crystal produced under conditions in accordance with the limitations set out in the foregoing is heat-treated in an atmosphere containing not less than 15% oxygen to obtain a superconducting $PrBa_2Cu_3O_Y$ single crystal.

A technique used in the production of nonsuperconducting $PrBa_2Cu_3O_Y$ by the conventional method is to conduct heat treatment in two stages, for example, at 500°–600° ° C. for about 25 hr and at 400°–500° C. for about 60 hr. When heat treatment is conducted in two stages in temperature ranges on this order, however, the critical temperature at which transition to superconductivity occurs does not increase even in the case of a $PrBa_2Cu_3O_Y$ single crystal which was produced by the method of this invention and exhibits superconductivity. The best that can be expected is a superconductor exhibiting superconductivity at 15K.

In contrast, when heat treatment is first conducted in a high-temperature region of 800°–880° C., preferably at 850° C., and is thereafter conducted in two stages at temperatures of the conventional level, a superconductor exhibiting high-temperature superconductivity can be obtained. When heat treatment is conducted at 850° C. for 12 hr, 500° C. for 30 hr, and 400° C. for 30 hr, for example, an 80K superconductor is obtained.

By use of a feed rod having or conferred with a high density, moreover, the crystal growth rate can be slowed to enable an even further improvement in the quality of the single crystal produced. It is preferable to use a feed rod formed to have a high density of not less than 95%.

As explained in the foregoing, this invention enables production of $PrBa_2Cu_3O_Y$ exhibiting a highly satisfactory degree of superconductivity by the floating zone method, notwithstanding that this has conventionally been considered impossible. This has a number of repercussions.

Specifically, even by the floating zone method it is possible to obtain $PrBa_2Cu_3O_Y$ with fully adequate high-temperature superconductivity provided that the specific production conditions are known. From this it follows that insofar as the conditions are defined it is also possible to obtain superconducting $PrBa_2Cu_3O_Y$ single crystal or thin film also by the top-seeded solution-growth method, the melt-powder-melt-growth method and thin-film epitaxy.

Based on this knowledge, the inventors propose superconducting devices made by combining superconducting $PrBa_2Cu_3O_Y$ crystal material and one or more types of $PrBa_2Cu_3O_Y$ crystal material produced by conventional production methods and exhibiting excellent insulating, semiconductor and normal conducting properties (termed generally as "non-superconducting" $PrBa_2Cu_3O_Y$ crystal material) and thus constituted solely of $PrBa_2Cu_3O_Y$ crystal material.

As will be understood from the foregoing, the superconducting $PrBa_2Cu_3O_Y$ crystal material and the non-superconducting $PrBa_2Cu_3O_Y$ crystal material can be produced by any method among the stationary slow cooling method, the top-seeded solution-growth method, the floating zone method, the melt-powder-melt-growth method and thin film epitaxy. It is therefore possible, for example, to fabricate a superconducting device according to this invention by combining $PrBa_2Cu_3O_Y$ crystal material produced by the top-seeded solution-growth method, the floating zone method, melt-powder-melt-growth method and/or thin film epitaxy and exhibiting various properties with normal conducting or insulating $PrBa_2Cu_3O_Y$ single crystal produced by the stationary slow cooling method, the top-seeded solution-growth method, the melt-powder-melt-growth method and/or thin film epitaxy.

The invention also enables devices to be fabricated by combining superconducting $PrBa_2Cu_3O_Y$ crystal material and non-superconducting $PrBa_2Cu_3O_Y$ produced by the same production method, thereby matching the lattice constants and thermal expansion coefficients. Since this eliminates the various problems arising from differences in lattice constant and thermal expansion coefficient, it enables good quality Josephson devices and other desired superconducting devices.

Since the superconductor-insulator transition points of the superconducting $PrBa_2Cu_3O_Y$ crystal obtained by this invention are much closer than in other superconductors, the rate of change in superconductivity with change in carrier density is greatly improved. The invention superconducting $PrBa_2Cu_3O_Y$ crystal therefore enables fabrication of high-performance superconducting three-terminal devices. The superconductivity of the invention superconducting $PrBa_2Cu_3O_Y$ can be easily be moved near normal conductivity or insulating state by controlling the amounts of Co, Ca, Ga, Zn and other elements added thereto. Its characteristics can therefore be regulated.

BRIEF DESCRIPTION OF THE DRAWINGS

FIG. 1 is a phase-equilibrium diagram of $PrBaO_3$-$BaCu_3O_4$ system.

DESCRIPTION OF THE PREFERRED EMBODIMENTS

Embodiments of the invention will now be explained.

Figure 2:
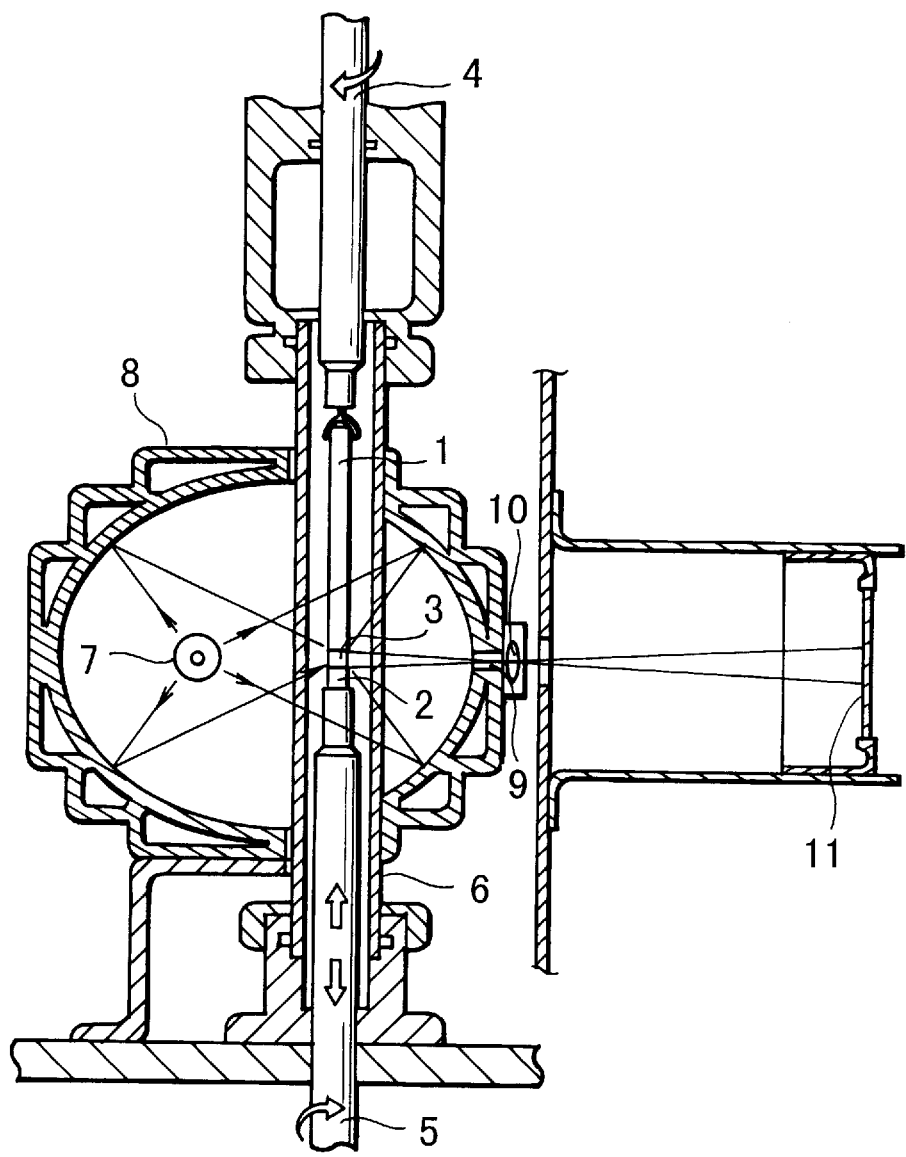
FIG. 2 is a vertical sectional view showing an example of a floating zone single crystal production apparatus used in this invention.

FIG. 2 is a schematic sectional view showing the structure of an example of a floating zone single crystal production apparatus which can be preferably used to implement this invention. In this figure, reference numeral 1 designates a feed rod, 2 a seed crystal, 3 a flux zone (solvent), 4 and 5 rotating shafts, 6 a quartz tube, 7 a halogen lamp, 8 rotating ellipsoidal reflectors, 9 an observation window, 10 a lens and 11 a projection screen.

A powder of $Pr_6O_{11}$, $BaCO_3$ and CuO mixed at a mole ratio of 1:2:3 was calcined at 880° C. for 15 hr, charged into a rubber tube and cold hydrostatic pressed into a round rod measuring 6 mm in diameter and 10 cm in length. The round rod was homogeneously sintered at 950° C. for 15 hours to obtain a $PrBa_2Cu_3O_Y$ feed rod 1. Similarly, a powder of $Pr_6O_{11}$, $BaCO_3$ and CuO mixed at an elemental ratio Pr:Ba:Cu of 1:7:18 was calcined at 880° C. for 15 hr and formed into a round rod of a diameter of 6 mm. The round rod was homogeneously sintered at 900° C. for 15 hr to obtain a solvent. A disk cut radially from this cylindrical rod-shaped solvent was adhered to the $PrBa_2Cu_3O_Y$ feed rod.

The cylindrical rod-shaped sample obtained by adhering the solvent to the tip of the $PrBa_2Cu_3O_Y$ ($PrBa_2Cu_3O_7$) feed rod was fixed to the upper feed rod rotating shaft 4 of the floating zone single crystal production apparatus, which utilized an infrared heating system. A $PrBa_2Cu_3O_Y$ single crystal was fixed to the lower rotating shaft 5 as the seed crystal 2. The seed crystal 2 and the $PrBa_2Cu_3O_Y$ feed rod 1 attached with the solvent were positioned so as not to be eccentric with respect to the rotating shafts.

Figure 3A:
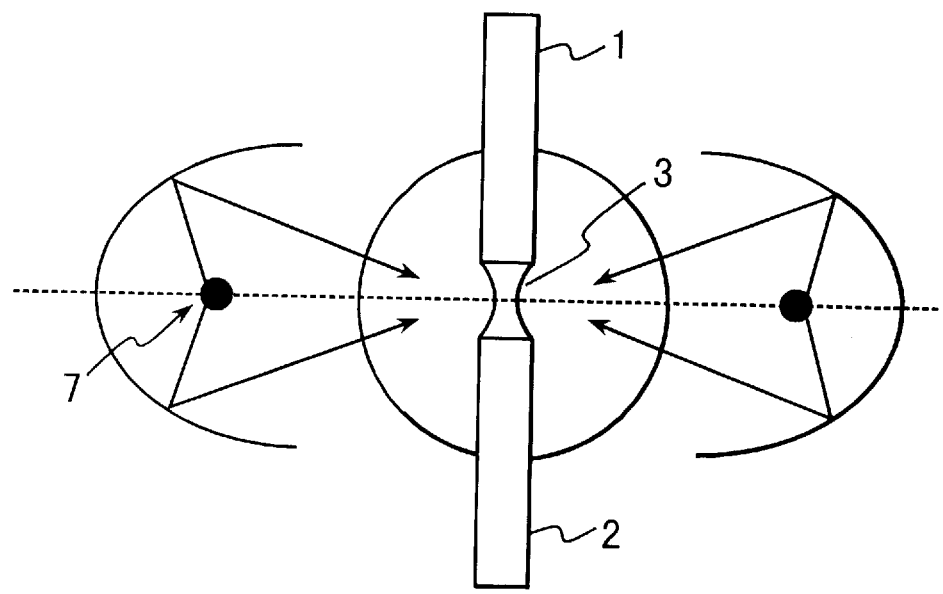
FIG. 3(A) is a schematic diagram showing an enlarged side view of the solvent zone in the single crystal production apparatus shown in FIG. 2, specifically in a single crystal production apparatus equipped with four rotating ellipsoidal reflectors.
Figure 3B:
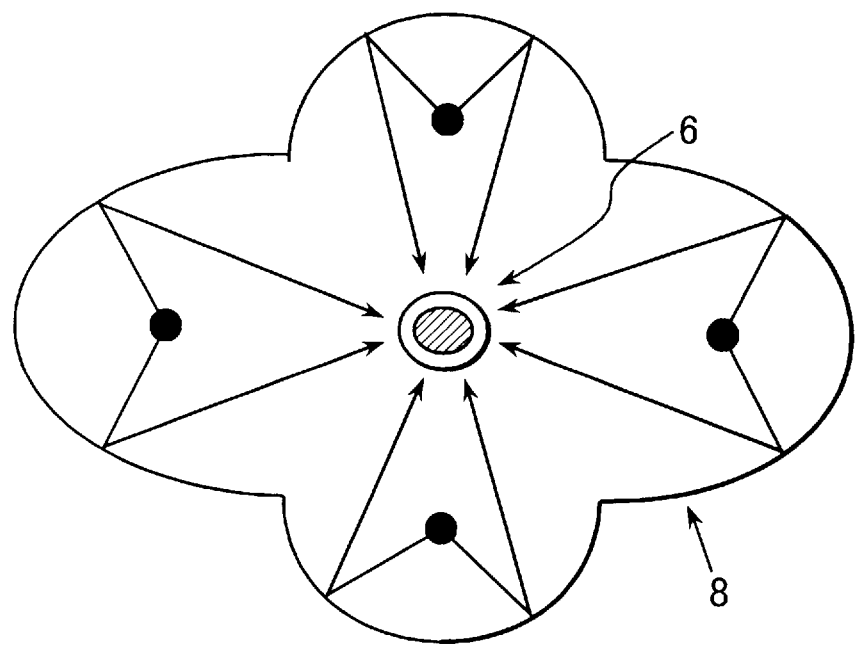
FIG. 3(B) is a schematic diagram showing an enlarged plan view of the solvent zone in the single crystal production apparatus shown in FIG. 2, specifically in a single crystal production apparatus equipped with four rotating ellipsoidal reflectors.

The interior of the quartz tube 6 was charged with nitrogen containing 0.1% oxygen. The solvent was melted by heating with infrared rays from the halogen lamp 7, the seed crystal 2 was brought into contact with the solvent, and the molten solvent was maintained between the feed rod and the seed crystal by the surface tension of the liquid (flux) The structure of this portion of the apparatus is shown schematically in enlarged sectional and plan views in FIGS. 3(A) and 3(B).

The feed rod 1 and the seed crystal 2 were then rotated in opposite directions at 20 rpm. In addition, the molten solvent was moved toward the feed rod at 0.5 mm/hr under a temperature gradient at the solid-liquid interface of 30° C./mm to grow $PrBa_2Cu_3O_Y$ single crystal on the seed crystal 2.

As a result, a cylindrical rod of $PrBa_2Cu_3O_Y$ single crystal measuring 4 mm in diameter and 8 mm in length was obtained. The product was confirmed to consist of single crystal by x-ray back-reflection Laue analysis. X-ray diffraction of powder of the single crystal showed it to consist of $PrBa_2Cu_3O_Y$ phase. Pr:Ba:Cu ratio was found to be 1.1:2.1:3.0 by use of an energy-dispersed x-ray diffraction analyzer.

Figure 4:
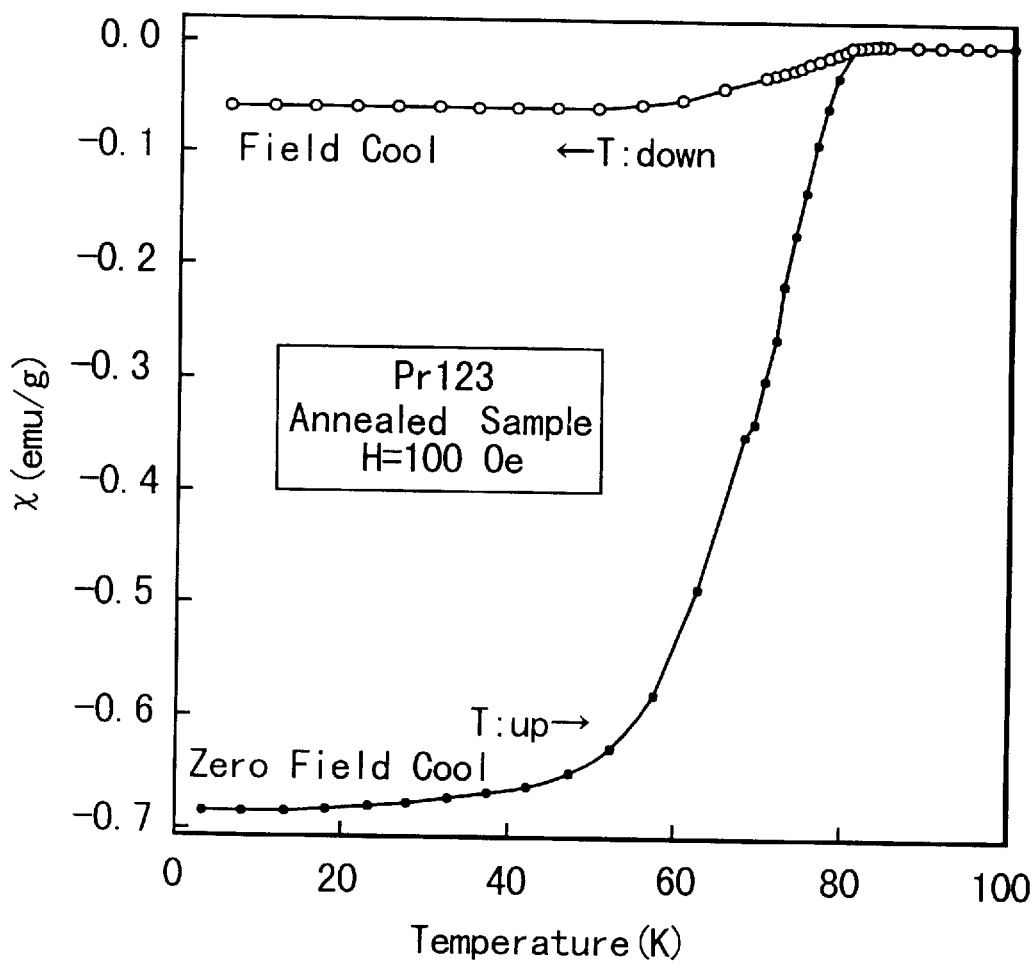
FIG. 4 is a graph showing the measured magnetic susceptibility of the $PrBa_2Cu_3O_Y$ single crystal heat-treated in oxygen according to the invention.

The single crystal was heat-treated in oxygen at 850° C. for 12 hr, at 500° C. for 30 hr and at 400° C. for 30 hr. As shown in FIG. 4, magnetic susceptibility measurement showed the product to be a superconductor having a critical temperature of 80K.

The invention thus enables production of good quality superconducting $PrBa_2Cu_3O_Y$ single crystal of a desired crystallographic axis according to the seed crystal in a relatively short time.

For the reason explained earlier, it will be understood that, provided the conditions are specified, it is also possible based on the teaching of the invention to produce $PrBa_2Cu_3O_Y$ exhibiting superconductivity by other production methods. Therefore, since non-superconducting $PrBa_2Cu_3O_Y$ was obtainable from before this invention, this invention enables provision of superconducting devices according to a totally new configuration principle.

Figure 5:
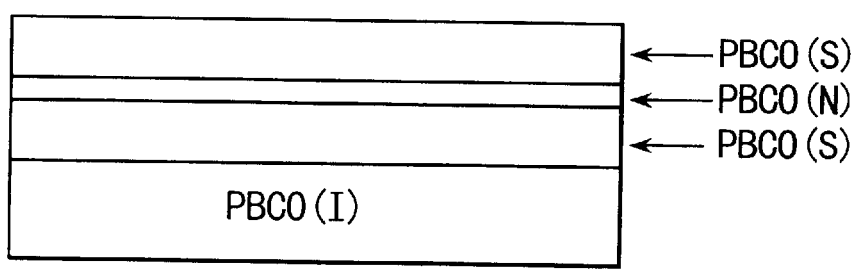
FIG. 5 is a schematic view of an embodiment of a $PrBa_2Cu_3O_Y$ superconducting device configured according to this invention.

FIG. 5 is a schematic view of an embodiment of a $PrBa_2Cu_3O_Y$ superconducting device configured according to this invention.

In this figure, PBCO(S) designates $PrBa_2Cu_3O_Y$ exhibiting superconductivity, PBCO(I) designates $PrBa_2Cu_3O_Y$ exhibiting insulating property producible by a conventional method, and PBCO(N) designates normally conductive $PrBa_2Cu_3O_Y$ also producible by a conventional method.

This embodiment is a Josephson junction device fabricated as a laminated thin film structure by epitaxially growing PBCO(S)/PBCO(N)/PBCO(S) on single crystal PBCO(I) as the substrate. Not only is this an entirely new structure, it possesses highly important and useful properties. Specifically, since it joins PBCO(S) thin film and PBCO(N) thin film epitaxially grown to have exactly the same lattice constant, the Josephson device exhibits excellent junction characteristics.

Devices fabricated in accordance with this configuration principle of the invention greatly alleviate the existing problems explained earlier. The invention thus provides Josephson devices, superconducting three-terminal devices and other high-temperature superconducting electronic devices exhibiting high quality and excellent performance.

Devices similar to the Si integrated circuit can be fabricated by changing a very small fraction of the PBCO(N) and PBCO(S) to a different PBCO.

What is claimed is:

1. A method of producing a superconducting $PrBa_2Cu_3O_Y$ single crystal comprising the steps of:

preparing a solvent consisting of a mixture of praseodymium oxide, at least one of barium oxide and barium carbonate, and copper oxide at a mixing ratio of between 1:3:5 and 1:8:20, disposing the solvent between a feed rod of $PrBa_2Cu_3O_Y$ formed to a high density and a seed crystal, heating the solvent to a temperature of 880°–980° C. in an atmosphere of an inert gas of at least one of argon and nitrogen mixed with 0.01–2% oxygen to form a floating solvent zone, moving the floating solvent zone toward the feed rod at 0.1–1.0 mm/hr under a temperature gradient at the solid-liquid interface of 25°–35° C./mm to precipitate single crystal on the seed crystal, and heat-treating the single crystal obtained in an atmosphere containing not less than 15% oxygen.

2. A method according to claim 1, wherein the inert gas is nitrogen.

3. A method according to claim 1, wherein the inert gas is argon.

4. A method according to claim 1, wherein the heat treatment is conducted in a high-temperature region of 800°–880° C. followed by two stages of heat treatment.

5. A method according to claim 1, wherein the $PrBa_2Cu_3O_Y$ single crystal produced is a superconductor at a temperature of 80K.

* * * * *